United States Patent [19]
Grief et al.

[11] Patent Number: 5,136,362
[45] Date of Patent: Aug. 4, 1992

[54] ELECTRICAL CONTACT WITH DIFFUSION BARRIER

[76] Inventors: Malcolm K. Grief, 2451 E. Woods End Ct., Boise, Id. 83706; Trung Doan, 1574 Shenandoah Dr., Boise, Id. 83712

[21] Appl. No.: 618,490
[22] Filed: Nov. 27, 1990
[51] Int. Cl.$^5$ .................. H01L 21/283; H01L 23/54
[52] U.S. Cl. ........................ 357/67; 357/71; 357/65; 357/68
[58] Field of Search .............. 357/67, 71, 68, 65

[56] References Cited

U.S. PATENT DOCUMENTS

| | | | |
|---|---|---|---|
| 3,701,931 | 10/1972 | Revitz et al. | 357/67 |
| 4,574,298 | 3/1986 | Yamagishi et al. | 357/71 |
| 4,887,146 | 12/1989 | Hinode | 357/67 |
| 4,926,237 | 5/1990 | Sun et al. | 357/67 |
| 4,990,997 | 2/1991 | Nishida | 357/71 |

*Primary Examiner*—William Mintel
*Assistant Examiner*—S. V. Clark
*Attorney, Agent, or Firm*—Workman Nydegger Jensen

[57] ABSTRACT

A device is provided by forming a diffusion barrier at the interface between a metalized contact and the surface of a semiconductor substrate. A three-layer sandwich is formed over the contact region and then annealed in free nitrogen. The sandwich is made of a titanium nitride layer interposed between layers of titanium. During the anneal, material from the titanium layer adjacent to the substrate migrates thereinto to produce a highly conductive diffusion region of titanium silicide. Concurrently during the anneal the other layer of titanium, which is exposed to the nitrogen atmosphere, is converted into a backing layer of titanium nitride which enhances the barrier effect of the titanium nitride layer at the center of the sandwich structure. The conversion of titanium to titanium nitride causes a physical expansion in the layer involved. This serves to enhance the thickness of the barrier layer at all locations, but of particular significance at the corners of the contact well. A diffusion region of controlled depth and the deposition of minimal amounts of titanium remote from the contact side itself are advantageous results of the disclosed process.

31 Claims, 11 Drawing Sheets

ELECTRICAL CONTACT WITH DIFFUSION BARRIER

BACKGROUND

1. Field of the Invention

The present invention relates to effecting a reliable electrical contact in a semiconductor device between a metalized wiring trace and a silicon substrate. More particularly the present invention pertains to a diffusion barrier for preventing the migration of silicon from the semiconductor substrate into the metalized electrical contact.

2. Background Art

Where a metalized wiring trace, such as a wiring trace of aluminum makes contact with the surface of a silicon substrate, silicon migration is common from the substrate into the metalized wiring trace under certain biasing conditions. This movement of silicon tends to displace aluminum at other parts of the associated semiconductor device. It also tends to erode the surface of the substrate, causing pitting at the contact site. Pitting of prolonged duration tends to produce deep fissures which can jeopardize the integrity of the PN junction at the edge of the conductivity well in which the electrical contact is being effected. This latter problem becomes particularly acute as the trend toward miniaturization and densification calls for shallower conductivity wells.

Thus, in the fabrication of semiconductor devices, structures must be included which prevent the migration of material from the semiconductor substrate into metalized electrical contacts through the interface at which such contact is effected. One solution has been to make metalized contacts out of aluminum saturated with silicon. This inhibits migration at the contact interface, but requires the use of relatively exotic metalization materials.

Alternatively, efforts have been undertaken to construct a barrier to silicon migration at the contact interface. In this approach, titanium nitride (TiN) has been found to offer promise. In layer form disposed between a silicon substrate and a metalized wiring contact, titanium nitride affords an acceptably low-resistance electrical coupling between the two materials on either side, while also functioning to retard the migration of silicon into the metalized layer. Typically, such diffusion barriers have either been deposited as titanium nitride directly on the surface of the substrate, or developed by annealing in an atmosphere of nitrogen a layer of titanium that has been previously deposited on the surface.

The barrier layers of titanium nitride need to be uniformly of a minimal thickness, if the barrier function is to be successful. While breaks in the barrier layer are obvious structural failures, it is not sufficient to effect mere continuity of the layer in order to achieve a satisfactory barrier. Any portions of the barrier layer that are overly thin will ultimately fail to prevent silicon migration, and thus be the cause of pitting and other migration-related problems.

The task of creating a diffusion barrier which at all locations exhibits at least the requisite minimum thickness has become increasingly difficult as the drive toward miniaturization and device densification continues in the field of semiconductor devices. Contacts between metalized wiring traces and the surfaces of a silicon substrate are in most instances effected by way of a contact well etched through an electrically insulating layer of silicon dioxide on the surface of the substrate.

One consequence of miniaturization and device densification is that less space is available to be used for such contact wells. Thus, the trend is to make them smaller. Nevertheless, as the diameter of such contact wells decreases, the deposition of material into the well from which to form a diffusion barrier becomes increasingly difficult.

This is due to the step coverage pattern observed to occur in deposition efforts at such wells. The material being deposited simply finds its way less readily into the contact well, rather than onto the top surface of the surrounding insulative layer. Even the deposited material that does enter the well has about as much likelihood of ending up on the walls of the contact well as on its floor. It is only on the floor, however, that the deposited material can truly be effective in producing a diffusion barrier.

Typically, the step coverage pattern that results is characterized by a very then layer of the material at the bottom of the contact well even when a thick layer is produced on the top of the surrounding insulative layer. In the typical step coverage pattern, an overhang structure made of the deposited material develops on the top of the sides of the contact well near its opening. The overhang structure is created from material which otherwise should have been deposited on the floor of the contact well. The overhang also closes the opening to the contact well, in effect shadowing the well floor from the deposition of additional material. The problem of thin depositions on the floor of a contact well is particularly acute at the periphery of the floor near the corners between the floor and the walls.

Poor thin floor layering and corner coverage begin to be dominating characteristics in contact wells having the combination of depths in the range of from about 1.00 to about 2.00 microns and widths in the range of from about 0.70 microns to about 1.00 microns. Under such circumstances, the thickness of the floor layer will be only approximately 30 percent to approximately 50 percent of the thickness of the layer on the top surfaces of the surrounding insulation layer. In addition, overhang structures on the sides of the well cause the floor layer to be even thinner at its periphery.

The problem of the inadequate deposition of material into a contact well cannot be resolved by simply depositing thicker layers of that material over the entire substrate. The materials deposited in creating diffusion barriers, namely, pure titanium (Ti) and titanium nitride (TiN) are not particularly good electrical conductors. Thick accumulations of such materials on the surface of a substrate will require in turn that the metalized wiring traces be correspondingly thicker if standard specification requirements for low wiring trace conductivity are to be complied with.

Concrete examples of these problems will be appreciated through a discussion of two known, but flawed, methods of creating diffusion barriers of titanium nitride.

FIG. 1 illustrates a typical semiconductor silicon substrate 10, having formed at the surface 12 thereof a P-type conductivity well 14 having a lower boundary 16 comprising a PN junction with the balance of the material of substrate 10. Formed on surface 12 of substrate 10 is a relatively thick electrically nonconductive insulative layer 18, typically comprised of silicon dioxide (SiO$_2$). In order to effect electrical coupling with substrate 10, it is necessary to form a contact well through insulative layer 18 to surface 12.

The commencement of this process is illustrated in FIG. 1 by the formation on insulative layer 18 of a patterned resist mask 20 having an opening 22 developed therein at a position corresponding to the desired location for an electrical contact with substrate 10. The structure in FIG. 1 is then subjected to a controlled, dry anisotropic etching, typically in a plasma of carbon tetrafluoride ($CF_4$).

When etching through insulative layer 18 is completed, photo-resist mask 20 is removed, resulting in the structure illustrated in FIG. 2A. There a contact well 24 can be seen to have been formed through insulative layer 18 so as to have a floor 26 and walls 28. As the purpose of contact well 24 is to permit electrical contact to be made with surface 12 of substrate 10, floor 26 of contact well 24 defines a contact surface on substrate 10. Before the surface of the structure shown in FIG. 2A is metalized, however, it is necessary to produce on floor 26 of contact well 24 a barrier to the migration of silicon from substrate 10 into such a metalized wiring trace.

A first known method for producing such a diffusion barrier is illustrated in the sequence of FIGS. 2A, 2B, 2C and 2D. A clearer understanding of the process and problems involved will be gained by reference also to the enlarged detail views appearing in FIGS. 3A, 3B, and 3C of the corners 30 at the outer periphery of floor 26 of contact well 24.

The walls 28 of contact well 24 are etched to remove therefrom polymers deposited during the dry etch in carbon tetrafluoride. Then a first layer 32 of titanium is formed by sputtered deposition on floor 26 and walls 28 of contact well 24, as well as on the top surface 33 of insulative layer 18. This is accomplished by placing semiconductor substrate 10 in a semiconductor processing chamber at low pressure and biasing substrate 10 as a cathode relative to a target anode a of titanium. Argon introduced into the pressure chamber is ionized to produce a plasma. The plasma impacts the titanium target, freeing ions thereof into the rarified gas of the processing chamber. The ions of titanium are driven by the electrical bias established between substrate 10 and the titanium target toward substrate 10, accumulating on the surface thereof as first layer 32.

At this point the step coverage phenomenon becomes relevant for the first time. In FIG. 2A the contact well 24 depicted is intended to be a contact well of relatively small dimension. Contact well 24 has a diameter in the range of from about 0.70 to about 1.00 microns and a relatively high aspect ratio of about 1 (1.00), which results in a depth of from about 1.00 to about 2.00 microns. As a result, the disposition of first layer 32 of titanium in contact well 24 is not uniform. Atoms of titanium moving towards floor 26 of contact well 24 are in many instances drawn onto walls 28 instead. This results in the depositions of titanium on floor 26 of contact well 24 assuming the form of a relatively thin portion 34 of first layer 32. Thin portion 34 is thickest at the center of floor 26, but tapers toward corner 30 of contact well 24. This thinning is partially a result of the diversion onto walls 28 of material otherwise destined to accumulate on floor 26 of contact well 24. The accumulation of titanium onto walls 28, however, also forms overhang portions 36. These tend to shadow corners 30 from subsequent deposition and to thereby increase the thinning of depositions on floor 26 at its periphery. The resultant coverage at corner 30 of contact well 24 by first layer 32 of titanium is relatively unsatisfactory, as shown with additional detail in FIG. 3A.

Thereafter, the structure shown in FIG. 2B is annealed at a high thermal temperature in ambient nitrogen. In this manner, first layer 32 of titanium is progressively converted from its exposed surface into a strata 38 of titanium nitride (TiN). Titanium does not react during annealing with insulative layer 18. Thus, the portions of first layer 32 of titanium on the top surface of insulative layer 18 and on walls 28 of contact well 24 are able to be fully converted to titanium nitride.

The titanium nitride layer produced exhibits a volume somewhat enlarged from that of the original titanium layer 32. Thus, strata 38 (FIG. 2C) of titanium nitride is thicker proportionately than original layer 32, both on the top surface 33 of insulative layer 18 and on walls 28 of contact well 24.

While titanium nitride functions very desirably as a barrier to the diffusion of silicon from substrate 10 into the metalized contact that will eventually be placed in contact well 24, the thickest portions of strata 38 of titanium nitride are not formed in the areas in which electrical coupling is to be effected with substrate 10. These thicker portions include upper layer 40 on the top surface of insulative layer 18 and overhang portions 42 on walls 28 of contact well 24. Disadvantageously, overhang portion 42 tapers into an extremely thin structure at corner 30 of contact well 24. On the very floor 26 of contact well 24, the formation of titanium nitride is particularly unsatisfactory, resulting in a thin portion 44 of strata 38 of titanium nitride.

The reason that the layer of titanium nitride in the floor 26 of contact well 24 is so minimal relates to the interaction between thin portion 34 of first layer 32 of titanium shown in FIG. 2B with the material of substrate 10 upon which thin portion 34 is originally disposed. During annealing, while the exposed surface of thin portion 34 is reacting with free nitrogen to form titanium nitride, the material of thin portion 34 adjacent to substrate 10 is induced by the heat of annealing to migrate across surface 12 thereof into the lattice of silicon substrate 10, forming a diffusion region 46 (FIG. 2C) of titanium silicide ($TiSi_2$). As this process occurs more rapidly than the conversion of titanium into titanium nitride at the surface of thin portion 34, most of the titanium in thin portion 34 is consumed in producing diffusion region 46. Only a small surface fraction of thin portion 34 of first layer 32 of titanium is available for conversion into the migration barrier material, titanium nitride, in thin portion 34 of strata 38.

Thus, at floor 26 of contact well 24, a dual conversion process occurs relative to the titanium of first layer 32 thereupon. This process will be discussed with additional clarity in relation to FIG. 3A, which is a schematic, detailed view of corner 30 of contact well 24 illustrating the effects on the mass of thin portion 34 of first layer 32 of titanium from the formation of diffusion region 46 alone. It should be understood that at the same time as diffusion region 46 is being formed from the mass of thin portion 34 of first layer 32 the balance of thin portion 34 is being converted into titanium nitride. In order to enhance a clear understanding of the dual processes involved, reference is made to FIG. 3B.

There the surface 48 of the original profile of thin portion 34 of first layer 32 of titanium is illustrated for comparison by a dashed boundary. The migration of titanium from what was thin portion 34 of first layer 32 into substrate 10 results in the formation of diffusion region 46 of titanium silicate. That process, however, causes expansion in the silicon involved, raising the former floor 26 of contact well 24 in a domed surface 50 elevated even in relation to the former top surface 48 of thin portion 34 of first layer 32.

It can further be observed in FIG. 3B that most of the mass of former thin portion 34 has been consumed in this process, leaving therefrom only a surface layer 52 of titanium for reacting with ambient nitrogen in the annealing process to produce a barrier layer of titanium nitrite. Overhang portion 36 of first layer 32 of titanium is shown in FIG. 3B as substantially unchanged, as titanium does not migrate into insulative layer 18. Accordingly, the full mass of overhang portion 36 remains in place in order to participate in conversion during the annealing process into titanium nitride. Nevertheless, as has already been pointed out earlier, the portion of the diffusion barrier formed on walls 28 of contact well 24 contributes to the barrier function only at the very bottom of walls 28 at corner 30 of contact well 24. There, the amount of titanium remaining from the formation of diffusion region 46 is even less than the thickness of surface layer 52 toward the center of contact well 24.

FIG. 3C illustrates the effect of the second portion of the process occurring during annealing in which titanium in surface layer 52 and in overhang portion 36 of first layer 32 of titanium are converted into titanium nitride. In the process, the volume of the corresponding material is enlarged. Accordingly, in FIG. 3C for comparative purposes, the outer surface 54 of overhang portion 36 and the upper surface 56 of surface layer 52, both of titanium, are indicated by dashed lines. In place of each, respectively, appear overhang portion 42 and thin portion 44 of strata 38 of titanium nitride. The resultant upward expansion of surface layer 52 while minimal and the lateral expansion of overhang portion 42 at corner 30 of contact well 24 serves to thicken the layer of titanium nitride in the immediate area in which electrical coupling with substrate 10 is actually effected. Nevertheless, because of the rapidity of the migration of titanium from thin portion 34 of first layer 32 relative to the conversion of titanium in thin portion 34 into titanium nitride, the effectiveness of the resultant diffusion barrier is not reliable.

In an effort to increase the amount of titanium in surface layer 52 which is available for conversion into titanium nitride, the deposition of additional quantities of titanium on floor 26 of contact well 24 have been attempted. Two problems arise as a result first, the success of depositing titanium on floor 26 of contact well 24 is, however, reflected in extremely thick layers of titanium on the top surface 33 of insulative layer 18, which in turn calls for an increase in the thickness of the metalized layer deposited thereupon in forming a metalized lead 58 shown in FIGS. 2C and 3C in contact well 24 engaging strata 38 of titanium nitride.

Second while a diffusion region of titanium silicide, such as diffusion region 46, is desirable, diffusion region 46 need only be relatively shallow in order to accomplish its purpose of enhancing the conductivity of the interface effected at the contact surface defined by floor 26 of contact well 24. When additional titanium is deposited on floor 26, although some of the increase will be converted into titanium nitride, additional quantities of the increase just migrate into substrate 10, causing a deepening of diffusion region 46 thereinto. Diffusion region 46 thus extends closely to boundary region 16 of conductivity well 14 which has been known to produce shorting through conductivity well 14 into the portion of substrate 10 below boundary 16.

The method illustrated in FIGS. 2A through 2D and in FIGS. 3A through 3C thus has the dual drawback of producing an overly deep diffusion region of titanium silicide or in lieu thereof an overly thin barrier of titanium nitride on floor 26 of contact well 24 where the barrier to silicon migration is most essential. This problem is most critical in corners 30 of contact well 24, where the shadowing effect of overhang portion 36 of first layer 32 of titanium is most pronounced due to step coverage patterns of sputter deposition. Efforts to overcome one of these two flaws in the resultant electrical contact work against the other. Ameliorating one intensifies the other, and the method disclosed cannot ultimately be substantially improved.

Accordingly, resort has been made in the art to a second known method for producing a diffusion barrier, which is illustrated and will be discussed in relation to the series of steps depicted in FIGS. 4A through 4E in combination with the detailed view of FIG. 5. The second method, instead of relying upon the annealing process to produce the requisite layer of titanium nitride, deposits that layer utilizing reactive sputter deposition in an atmosphere of nitrogen. This modification then frees the semiconductor manufacturer from the need to place excessive titanium in the contact well in order that some of the titanium escape migration into the substrate to form a titanium silicate diffusion region. Accordingly, the titanium layer deposited in the first instance in the prior art method already described can be reduced in thickness, both on the floor of the contact well and on the upper surfaces of the insulative layer thereabout. The latter consequence then permits the use of thinner metalized wiring traces than are possible under standard conductivity specifications utilizing the method already described.

In FIG. 4A in the second method, a contact well 24 identical to that illustrated in FIG. 2A is formed through insulative layer 18 to surface 12 thereof. Contact well 24 has a floor 26 at surface 12 which defines the contact surface at which electrical coupling with substrate 10 is intended, walls 28, and corners 30. A first layer 32a of titanium is produced on top surface 33 of insulative layer 18, and floor 26 and walls 28 of contact well 24. In the second method, first layer 32a of titanium is not relied upon for the production of the ultimate barrier layer of titanium nitride. Accordingly, as can be appreciated by comparison, first layer 32a of titanium can be substantially thinner than first layer 32 of titanium shown in FIG. 2B. Nevertheless, because of the aspect ratio and the small diameter of contact well 24, first layer 32a of titanium is reduced on floor 26 of contact well 24 to a thin portion 34a, while on walls 28 of contact well 24 overhang portions 36a still tend to further shadow the development of coverage by titanium in corners 30 of contact well 24.

Before annealing the structure shown in FIG. 4B in order to develop from thin portion 34a thereof a diffusion region of titanium silicate, a first layer 60 (FIG. 4C) of titanium nitride is deposited on first layer 32a of titanium. This is accomplished in the manner of the sputter deposition of titanium, except that the process is conducted in an atmosphere of nitrogen, rather than argon.

In relation to layer 60, however, step deposition patterning is also apparent. Layer 60 of titanium nitride thus comprises a thin portion 62 at floor 26 of contact well 24 and overhang portions 64 on each wall 28 thereof. As layer 60 of titanium nitride is deposited over another layer, such as first layer 32a of titanium, which itself possesses an overhang portion, the ability to place material of layer 60 of titanium nitride at the bottom of contact well 24 and to insure the integrity of that layer at the corners 30 of contact well 24 is more difficult. Significantly, however, thin portion 62 of layer 60 of titanium nitride constitutes the totality of the structure by which migration of silicon across the contact surface is precluded.

Thereafter as shown in FIG. 4D, the structure of 4C is subjected to an annealing heat treatment. This treatment does not alter the material of layer 60 of titanium nitride, but only permits titanium in thin portion 34a of first layer 32a of titanium to migrate into substrate 10 producing diffusion region 46a of titanium silicide. This process increases the volume of material below thin portion 62 of layer 60 of titanium nitride lifting floor 26 of contact well 24 into a domed surface 50a upon which thin portion 62 of layer 60 of titanium nitride is lifted and stretched slightly in its lateral dimension.

Thereafter as shown in FIG. 4E, a metalized lead 58 is deposited filling contact well 24 and engaging layer 60 of titanium nitride. The diffusion barrier resulting includes layer 60 of titanium nitride in combination with a relatively shallow diffusion region 46a.

As can be seen in additional detail in the enlarged view appearing in FIG. 5, diffusion region 46a of titanium silicide is advantageously shallower than diffusion region 46 shown in FIG. 3C. The shallower penetration into substrate 10 by diffusion region 46a reduces the likelihood of shorting across boundary 16 of conductivity well 14. Nevertheless, even in the deposition of the material of layer 60 of titanium nitride in the bottom of contact well 24, it is difficult to produce an adequately thick diffusion barrier at that location without resorting to excessive depositions of titanium nitride on the top surface 33 of insulative layers 18. Frequently the combined thickness of first layer 32a of titanium and layer 60 of titanium nitride at that location is at least as great as the single strata 38 of titanium nitride produced in the first prior art method and shown in FIGS. 2C and 2D. This accordingly places similar constraints on efforts to thicken the actual diffusion barrier produced as were encountered in that earlier described prior art method.

The problems of breaches in that diffusion barrier continue in the second method to be most acute at corners 30 of contact well 24. The results is an unreliable diffusion barrier and continued problems of pitting which appear to be able to be overcome only by increasing the quantity of titanium and titanium nitride disposed on the top of the surrounding insulative layers. This in return is reflected in undesirably thick metalized wiring traces.

BRIEF SUMMARY AND OBJECTS OF THE INVENTION

Accordingly one object of the present invention is to reduce surface pitting and the associated risk of conductivity well shorting apparent when electrical coupling is effected with the surface of a semiconductor substrate.

Another object of the present invention is to produce a reliable diffusion barrier for an electrical contact with a semiconductor substrate which more effectively prevents silicon migration, even in an environment of increasing miniaturization and component densification.

Yet another object of the present invention is to produce a diffusion barrier as described above which possesses a shallow diffusion region and a thick barrier layer of titanium nitride free of debilitating thinning or discontinuities at the corners of the contact well in which the diffusion barrier is formed.

It is yet another object of the present invention to produce an electrical contact with the surface of a semiconductor substrate which reliably precludes silicon migration into the metalized wiring trace effecting the contact and which by minimizing the amount of titanium and titanium nitride deposited in forming the requisite diffusion barrier, permits the metalized wiring trace to be optimally thin.

It is yet another object of the present invention to produce a diffusion barrier as described which may be manufactured using known techniques and without substantial additional manufacturing steps.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims.

To achieve the foregoing objects, and in accordance with the invention as embodied and broadly described herein a method is provided for forming a diffusion barrier between a metalized contact and the surface of a semiconductor substrate. In the inventive method, the surface of the substrate is accessed to define thereat a contact region. A first layer of titanium is sputter deposited on the contact region followed by a reactive sputter deposited base layer of titanium nitride. A third layer, a backing layer of titanium, is then sputter deposited on the base layer of titanium nitride, and the entire structure is heated in an atmosphere of nitrogen.

As a result, the titanium from the first layer of titanium migrates into the surface of the substrate at the contact region to form a diffusion region of titanium silicide. The depth of the diffusion region can be kept within acceptable limits by controlling the thickness of the first layer of titanium.

During the heating, however, the backing layer of titanium is annealed to form a backing layer of titanium nitride disposed on the base layer of titanium nitride. Together these two adjacent layers of titanium nitride comprise a composite strata disposed between the surface of the diffusion region and the metalized electrical contact through which electrical coupling is effected with the substrate. The composite strata of titanium nitride is advantageously and reliably capable of preventing migration of silicon from the substrate into the electrical contact during operation of the semiconductor device of which the contact is a part.

The conversion of titanium in the backing layer to titanium nitride results in a volume expansion both in the portion of the backing layer on the floor of the contact well and on the walls thereof. At the corners of the contact well, this advantageously serves to thicken the diffusion barrier and close discontinuities therein.

A method is provided for forming diffusion barrier at the interface between a metalized contact and the surface of a semiconductor substrate. A three-layer sandwich is formed over the contact region and then annealed in free nitrogen. The sandwich is made of a titanium nitride layer interposed between layers of titanium. During the anneal, material from the titanium layer adjacent to the substrate migrates thereinto to produce a highly conductive diffusion region of titanium silicate. Concurrently during the anneal the other layer of titanium, which is exposed to the nitrogen atmosphere, is converted into a backing layer of titanium nitride which enhances the barrier effect of the titanium nitride layer at the center of the sandwich structure. The conversion of titanium to titanium nitride causes a physical expansion in the layer involved. This serves to enhance the thickness of the barrier layer at all locations, but of particular significance at the corners of the contact well. A diffusion region of controlled depth and the deposition of minimal amounts of titanium remote from the contact site itself are advantageous results of the disclosed process.

The invention disclosed herein also contemplates a diffusion barrier fabricated according to the inventive method, as well as an electrical contact incorporating such an inventive diffusion barrier. The intermediate semiconductor structure arrived at using the inventive method prior to the step of heating the substrate to produce titanium nitride or the diffusion region of titanium silicide is also considered to be within the scope of the disclosed invention.

As will be illustrated in the discussion which follows, a diffusion barrier produced according to the invention reliably prevents silicon migration without as a consequence causing either deep penetration of the substrate surface by titanium silicate diffusion regions, or the excessive deposition of titanium and titanium nitride on the surface of the structure. Advantageously, all deposition steps required in the inventive method can be performed in the same semiconductor processing chamber without intermediate handling.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The method and apparatus of the present invention will be described in relation to the sequence of illustrations comprising FIGS. 6A through 6E.

Figure 1:
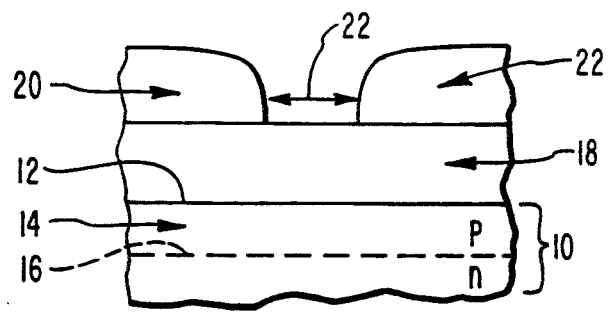
FIG. 1 is a cross sectional elevation view showing the manner in which a typical contact well is formed through an insulative layer to the surface of a semiconductor substrate.
Figure 2A:
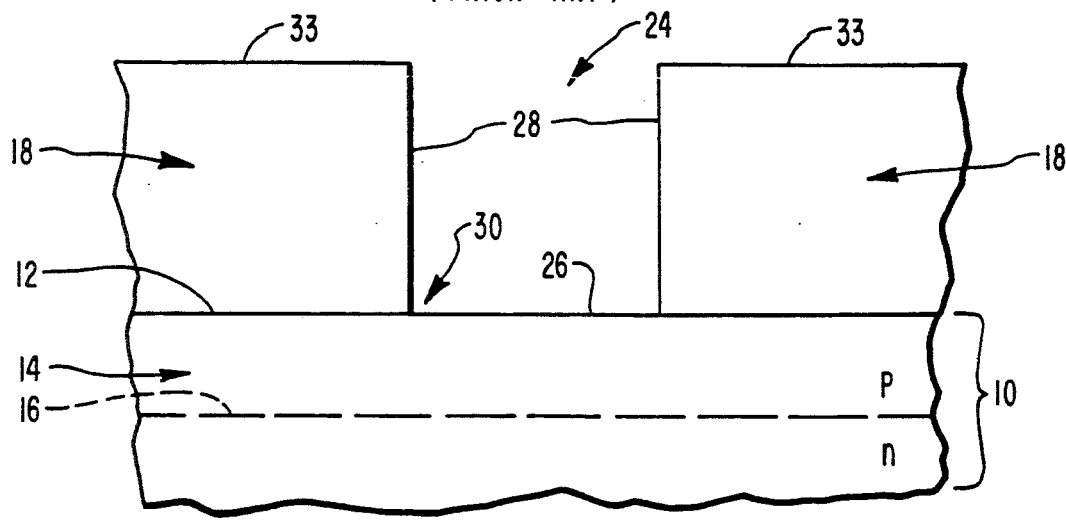
FIGS. 2A-2D are a sequence of cross sectional elevation views illustrating the steps in a first known method for producing a diffusion barrier associated with an electrical contact at the surface of a semiconductor substrate.
Figure 2B:
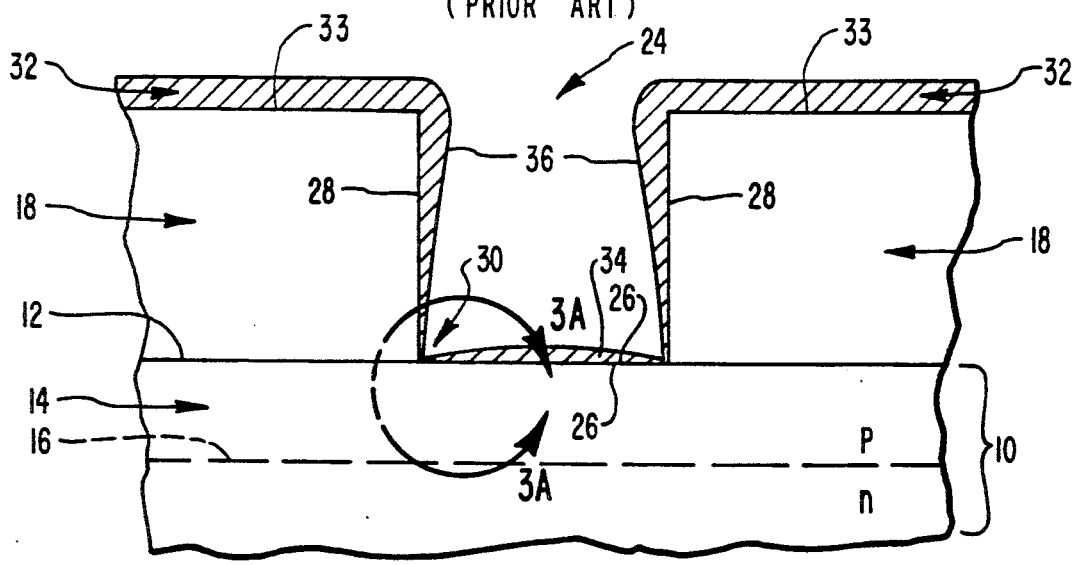
Figure 2C:
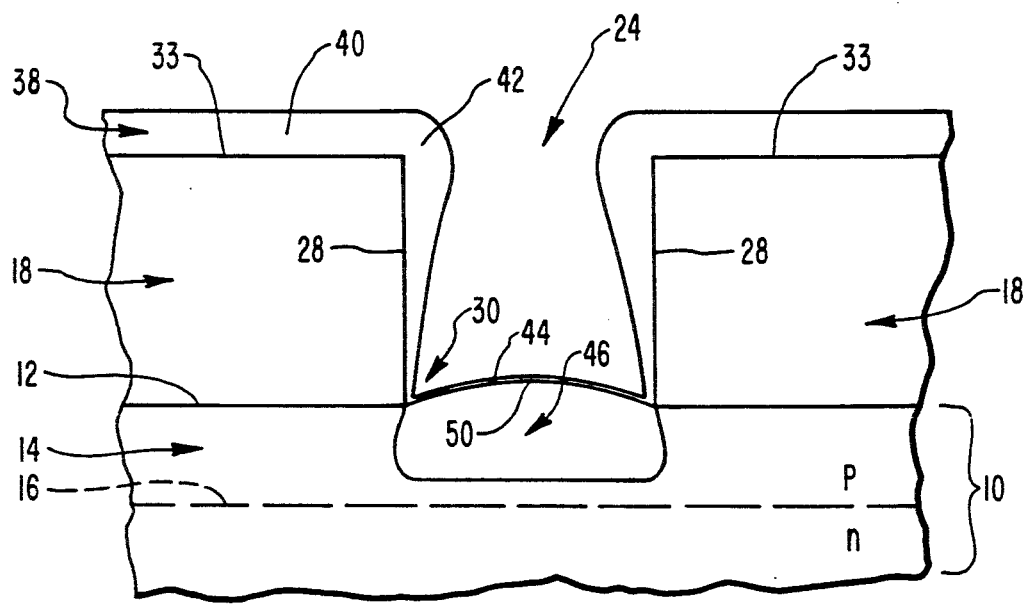
Figure 2D:
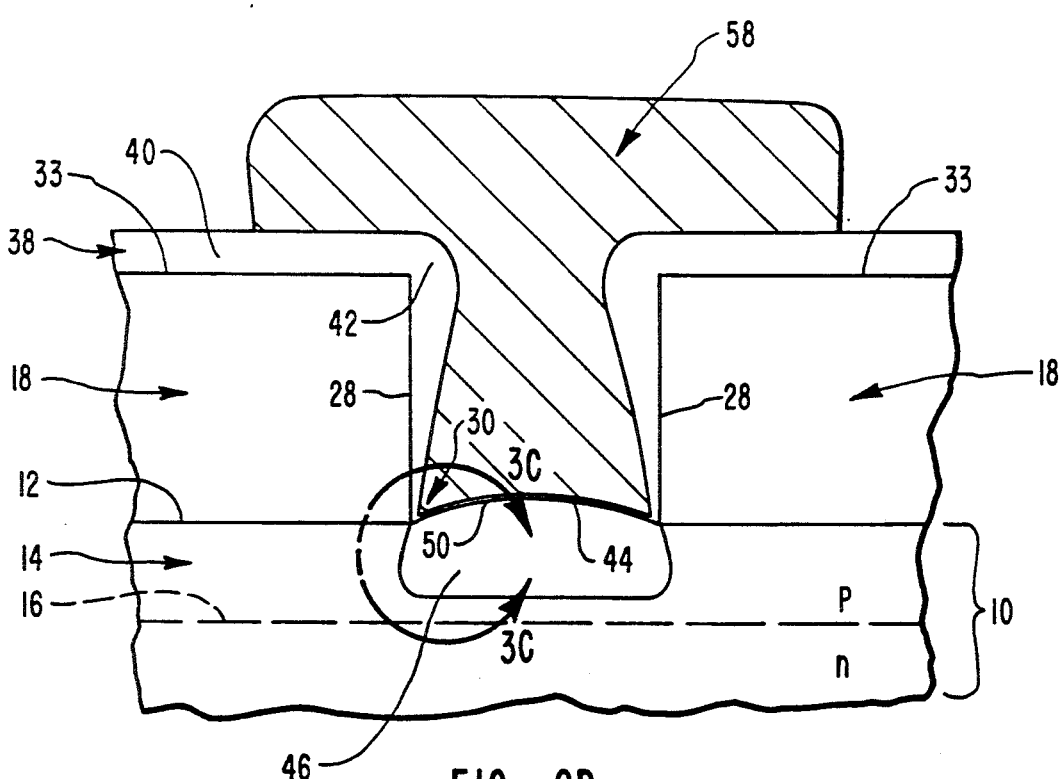
Figure 3A:
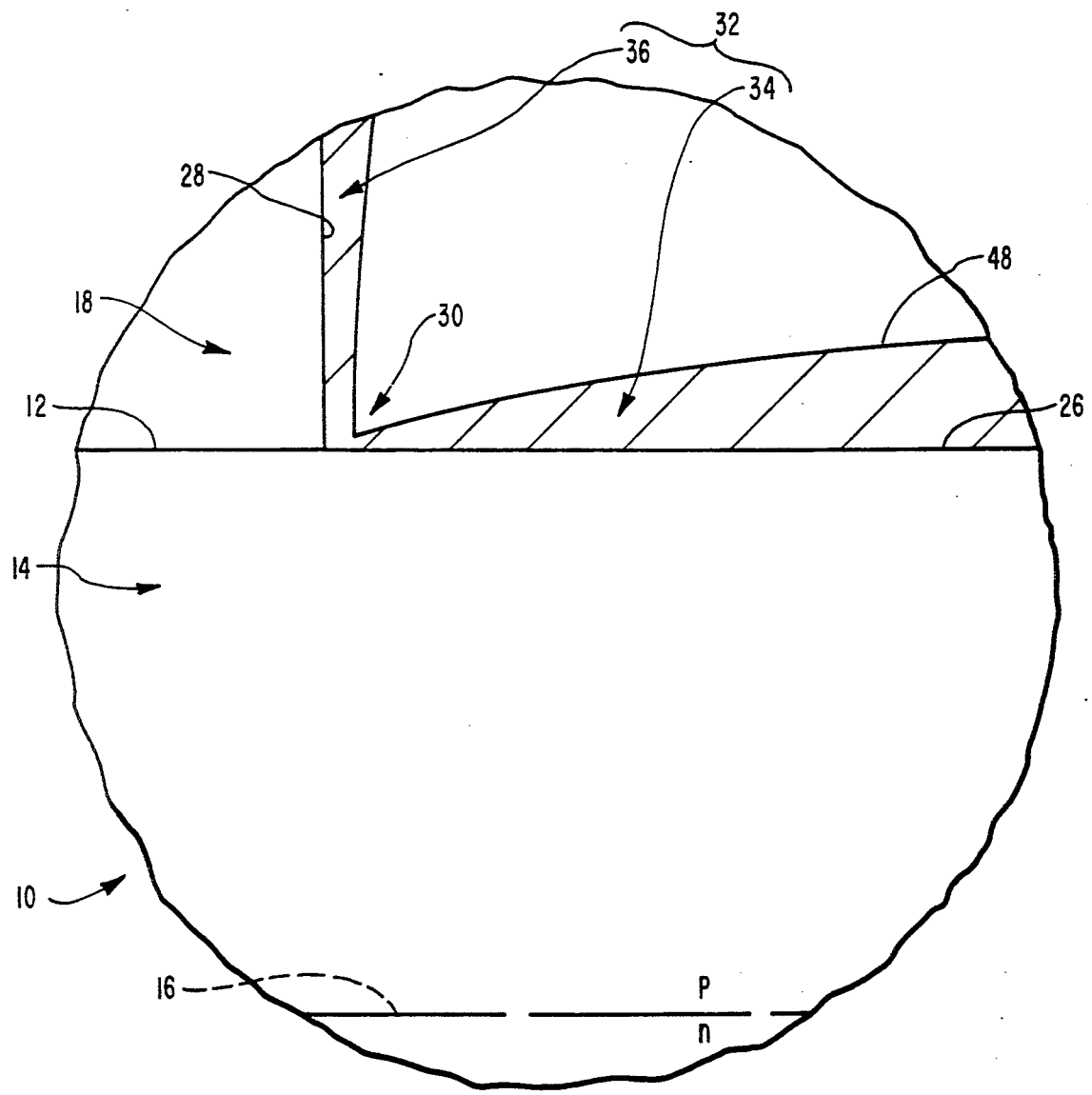
FIG. 3A is an enlarged detailed view of a portion of the structure illustrated in FIG. 2B.
Figure 3B:
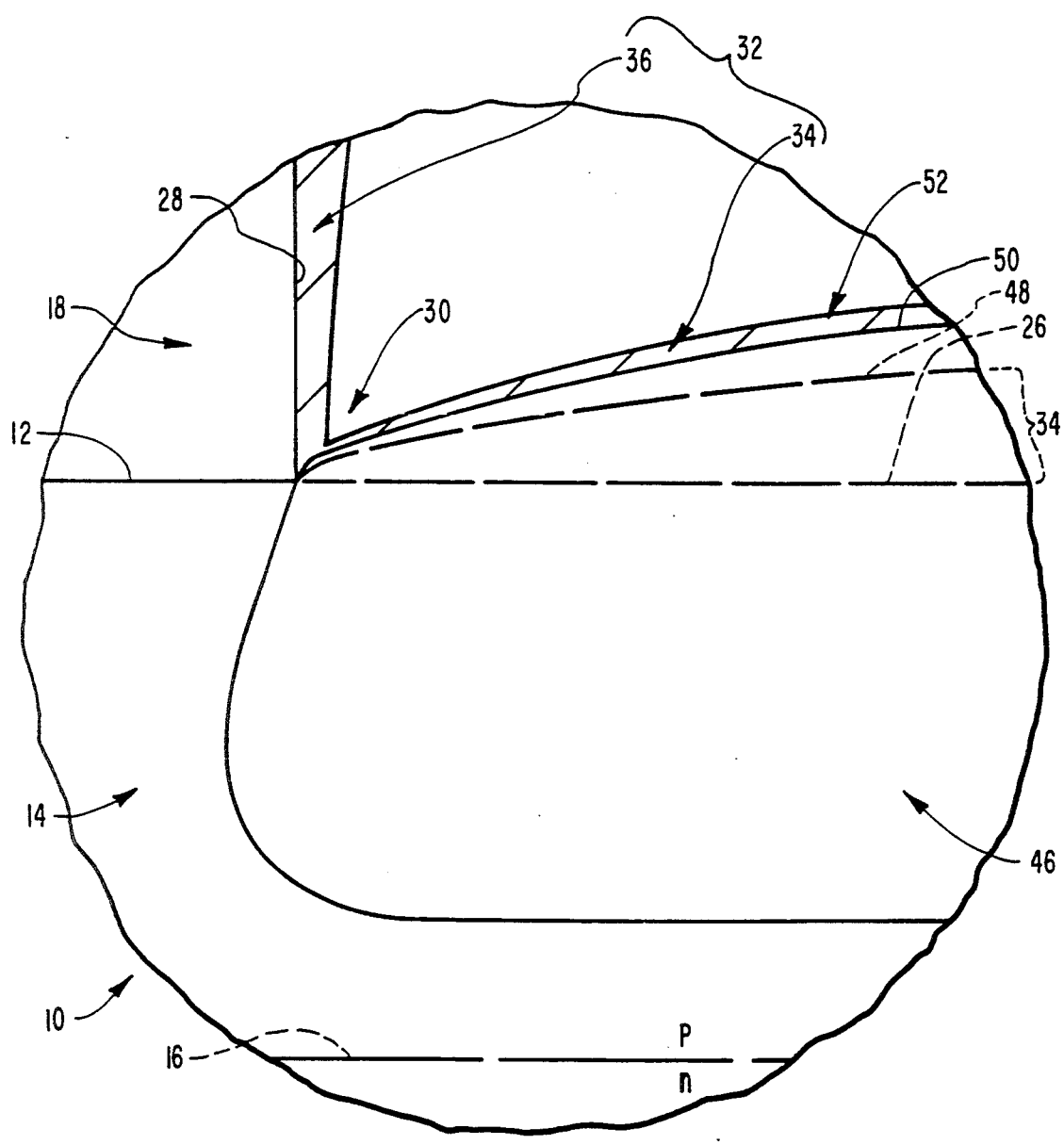
FIG. 3B is an enlarged view of the structure shown in FIG. 3A illustrating the effect of one of the two concurrently occurring processes when the structure in FIG. 3A is subjected to heat treatment.
Figure 3C:
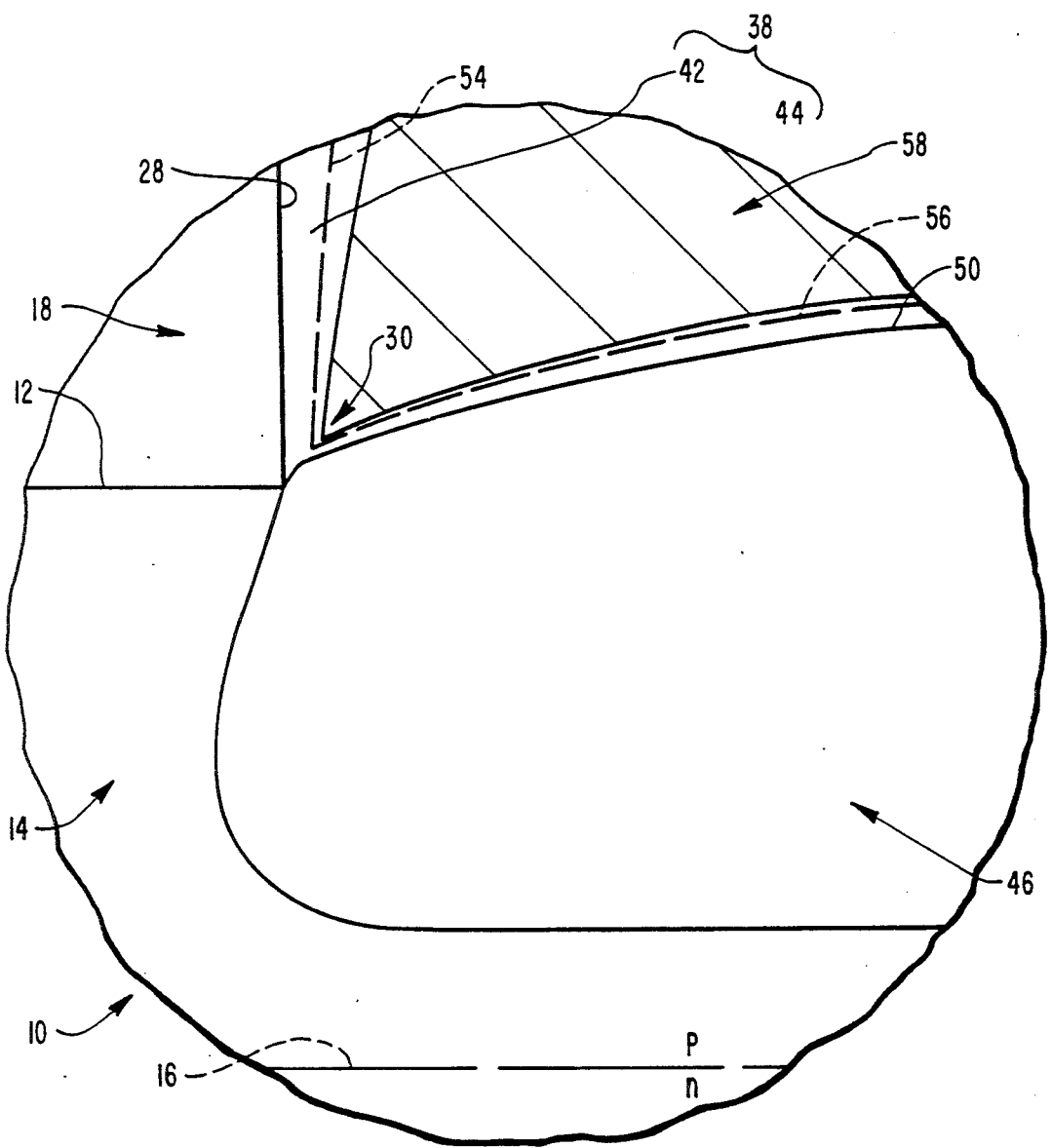
FIG. 3C is an enlarged view of a portion of FIG. 2D.
Figure 4A:
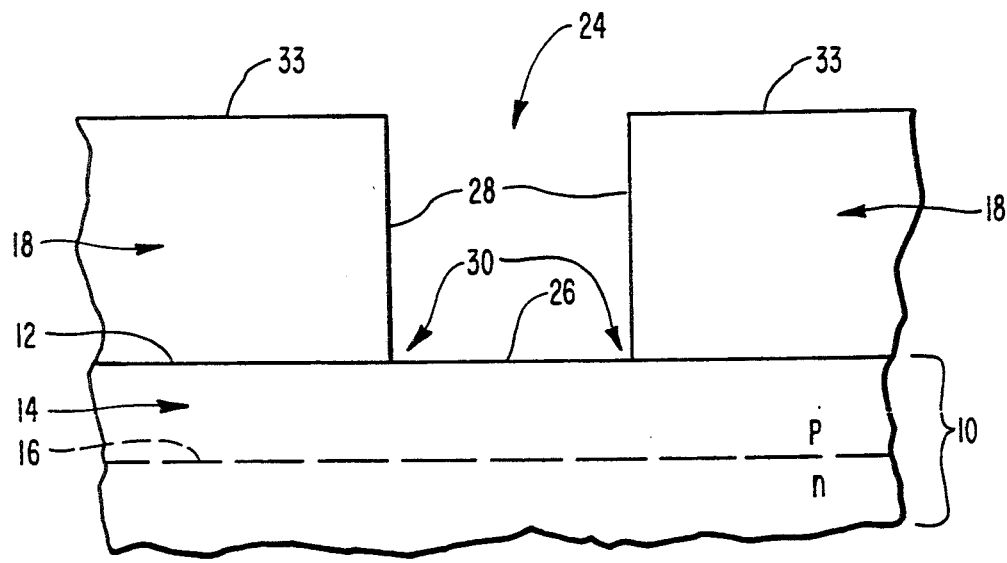
FIGS. 4A-4E are a sequence of cross sectional elevation views illustrating a second known method for producing a diffusion barrier associated with an electrical contact with the surface of a semiconductor substrate.
Figure 4B:
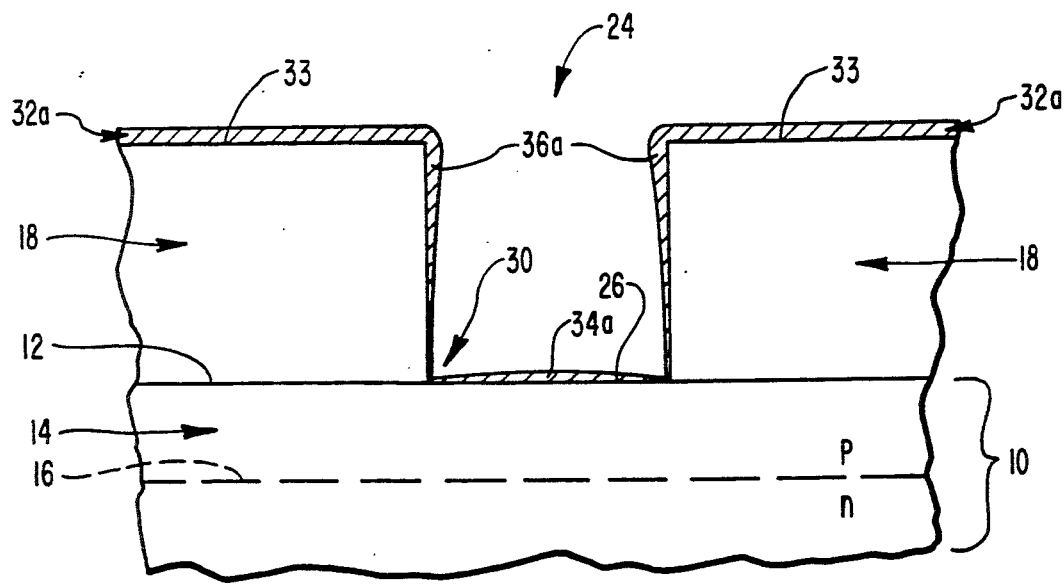
Figure 4C:
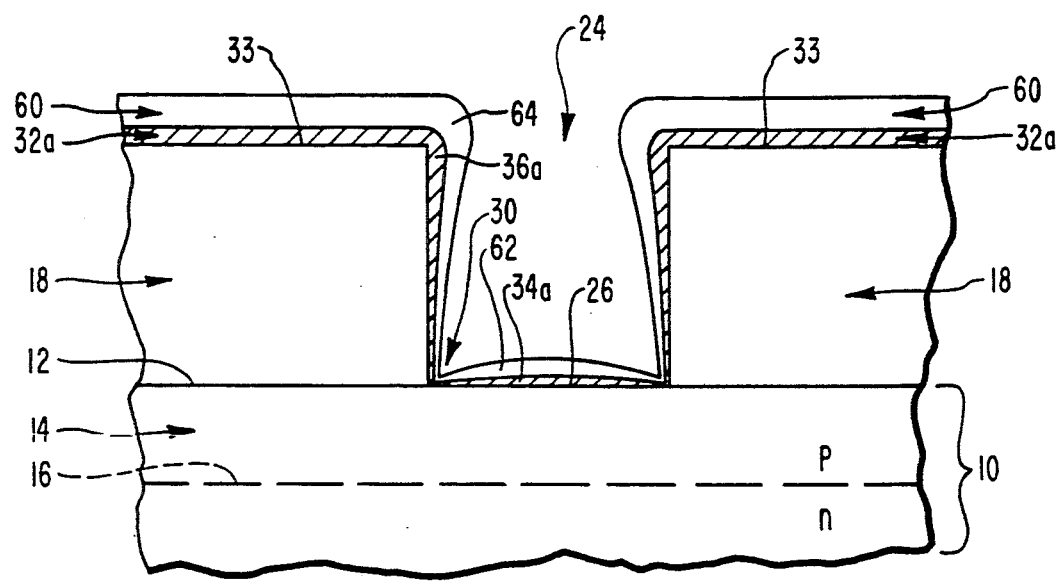
Figure 4D:
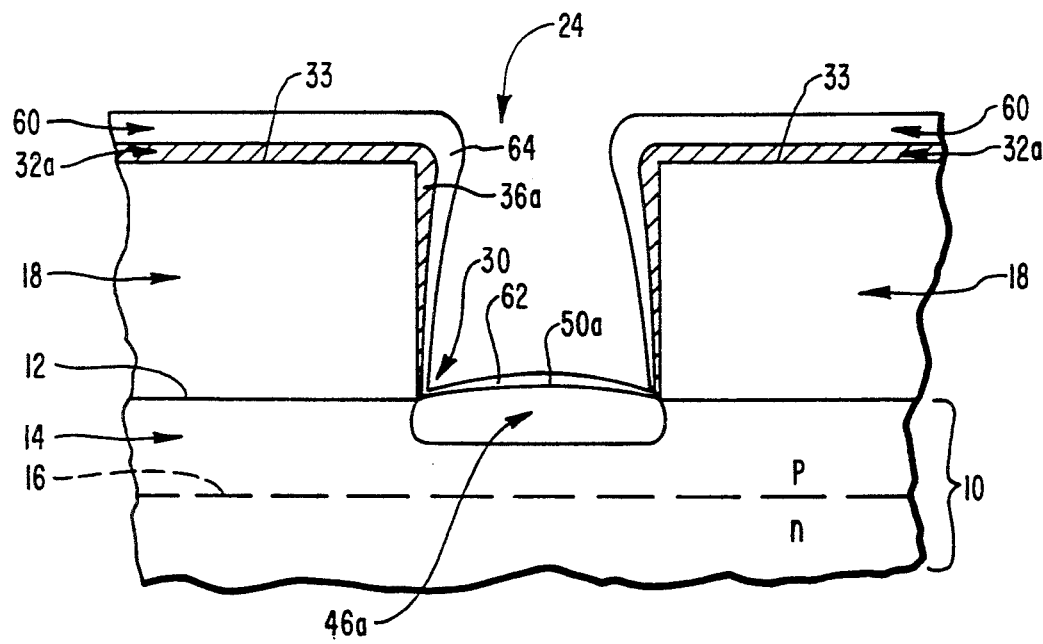
Figure 4E:
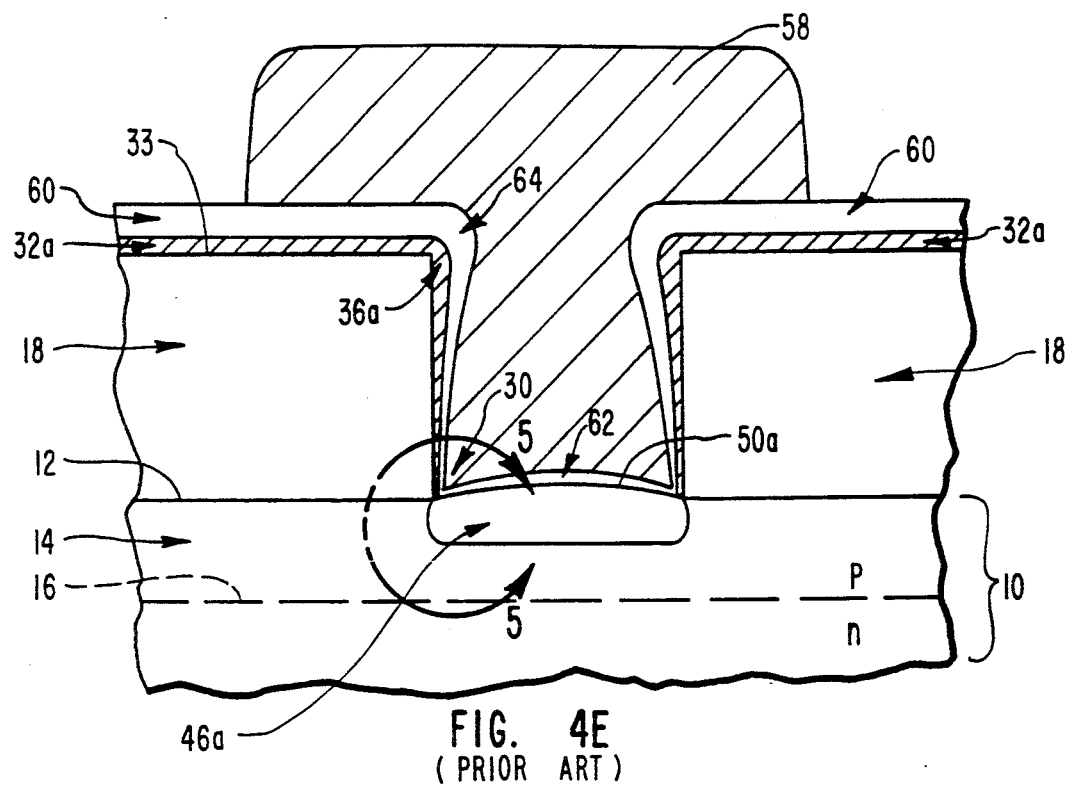
Figure 5:
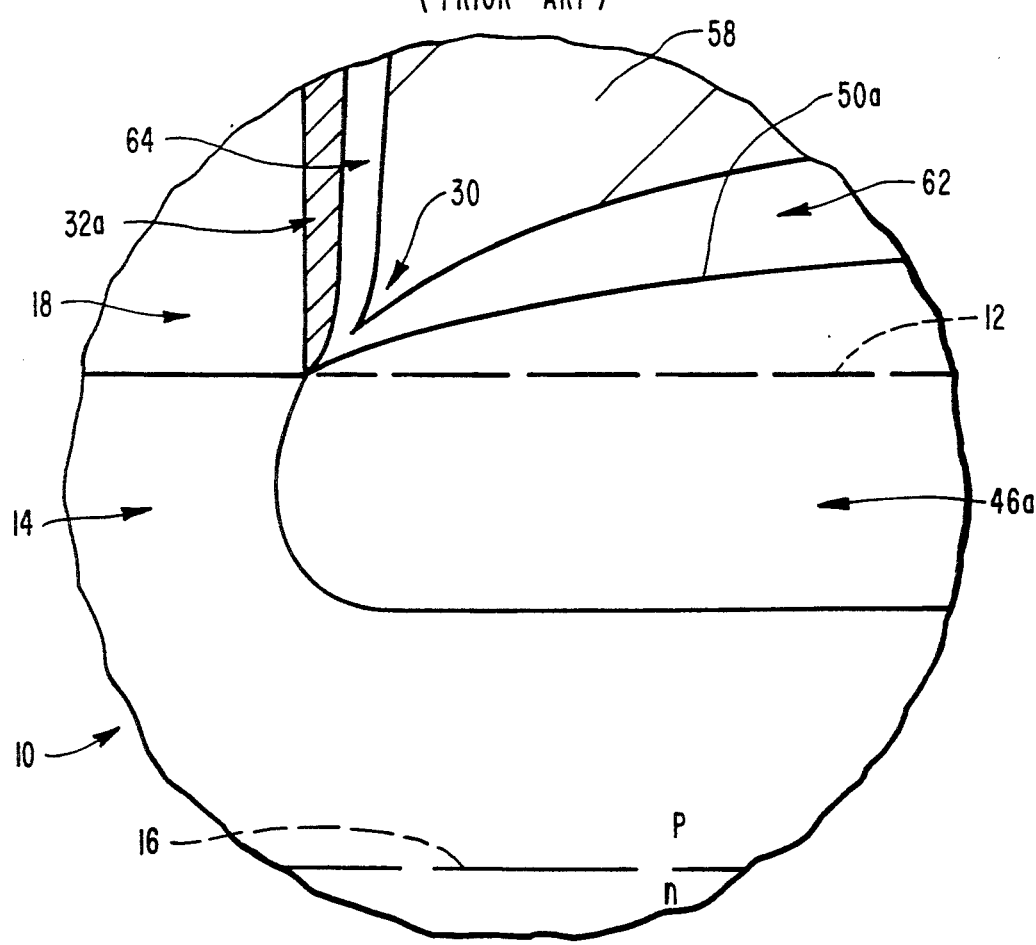
FIG. 5 is a detailed view of a portion of the structure illustrated in FIG. 4E.
Figure 6A:
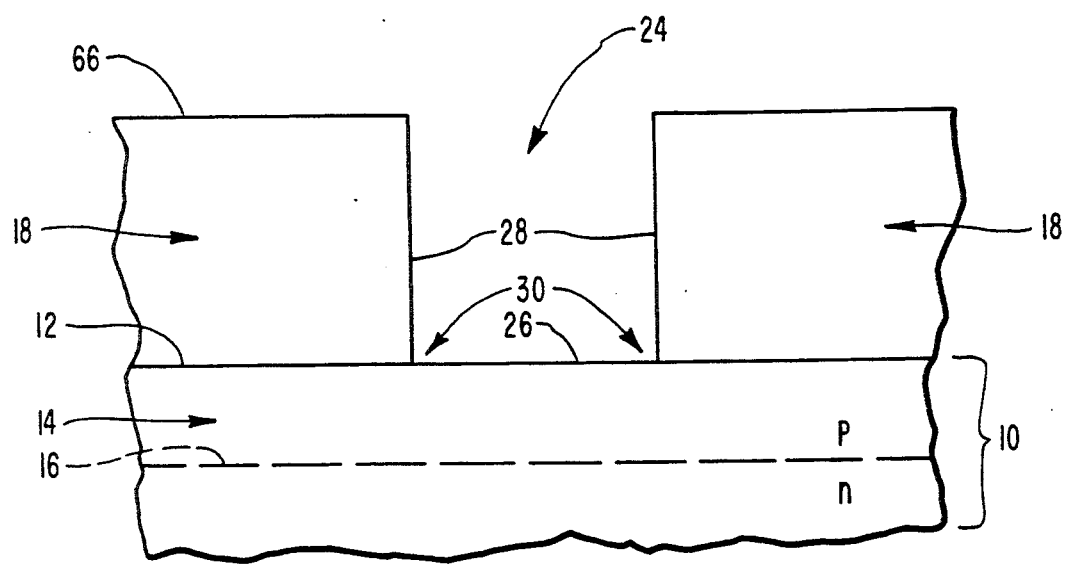
FIGS. 6A-6E are a sequence of cross sectional elevation views illustrating the steps for producing a diffusion barrier associated with an electrical contact at the surface of a semiconductor substrate using the teachings of the present invention.

In FIG. 6A, a contact well 24 has been formed through insulative layer 18 to surface 12 of substrate 10. Contact well 24 has a floor 26 at surface 12 of substrate 10 and walls 28 which are normal to and meet floor 26 at corners 30. Floor 26 of contact well 24 defines a contact surface on substrate 10 through which electrical coupling is to be effected. The formation of contact well 24 is effected typically using an isotopic dry etch of upper surface 66 of insulative layer 18 through a patterned photo resist mask in a plasma of carbon tetrafluoride ($CF_4$). This is followed by a secondary etch to remove from walls 28 polymers typically produced thereupon during the dry etch.

Figure 6B:
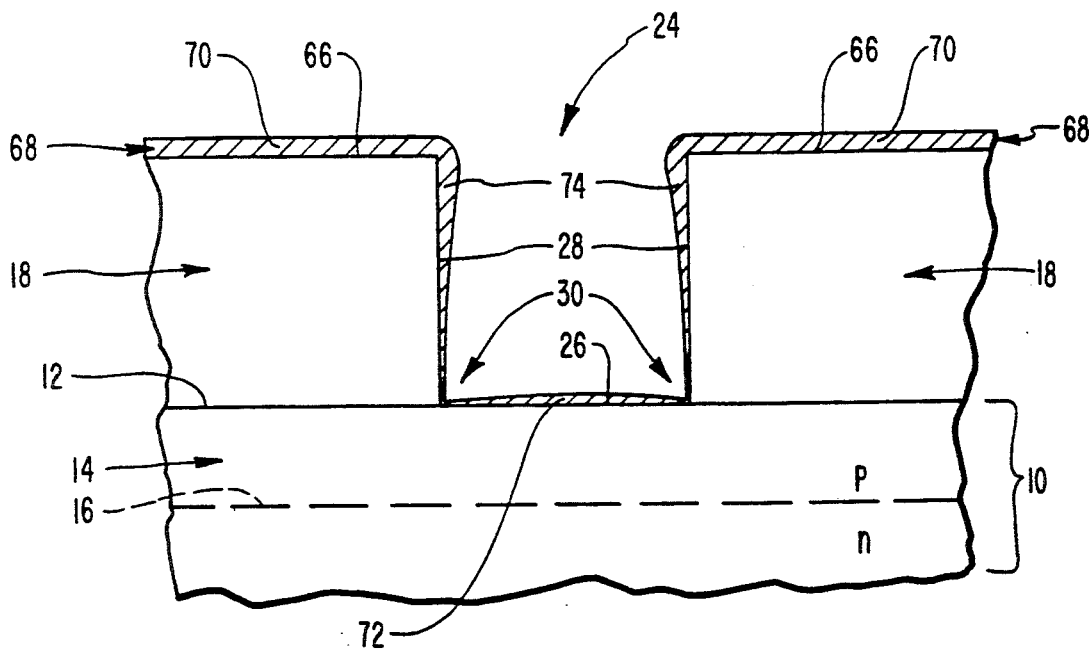

As shown in FIG. 6B, a first layer 68 of titanium (Ti) is then deposited on upper surface 66 of insulative layer 18 and in contact well 24 on walls 28 and floor 26 thereof. In this manner first layer 68 of titanium is deposited on the contact region through which electrical coupling with substrate 10 is intended. First layer 68 of titanium is formed using sputter deposition techniques. At a low pressure a target of titanium is positively biased relative to substrate 10. An atmosphere of argon is introduced and ionized in the electrical field to produce a plasma which impacts the titanium target. Due to the impacts on the target of the plasma, free ions of titanium are scattered therefrom and then driven by the electrical bias between the target and silicon substrate 10 towards the substrate which functions as a cathode.

Under conditions of increased miniaturization and component densification, contact well 24 typically will have a depth in the range of from about 1.00 microns to about 2.00 microns, and a width in the range from about 0.70 microns to about 1.00 microns. Under such conditions, step coverage patterns in the deposition of first layer 68 of titanium are apparent and first layer 68 of titanium comprises an upper portion 70 disposed on upper surface 66 of insulative layer 18, and a thin portion 72 on floor 26 of contact well 24. For the dimensions of contact well 24 stated above, thin portion 72 can be expected to exhibit a thickness of from about 30 percent to about 50 percent of the thickness of upper portions 70. Thin portion 72 exhibits its maximum thickness at the center of floor 26 of contact well 24, thinning in a peripheral direction therefrom toward corners 30.

The peripheral thinning of thin portion 72 is a consequence both of the step coverage phenomena and the shadowing effect of overhang portions 74 located against walls 28 of contact well 24 between upper portions 70 and thin portion 72. While overhang portion 74 intrudes into the opening to contact well 24 near top surface 66 of insulative layer 18, like thin portion 72 of first portion 68 of titanium, overhang portion 74 thins noticeably in the direction of corners 30 of contact well 24.

Figure 6C:
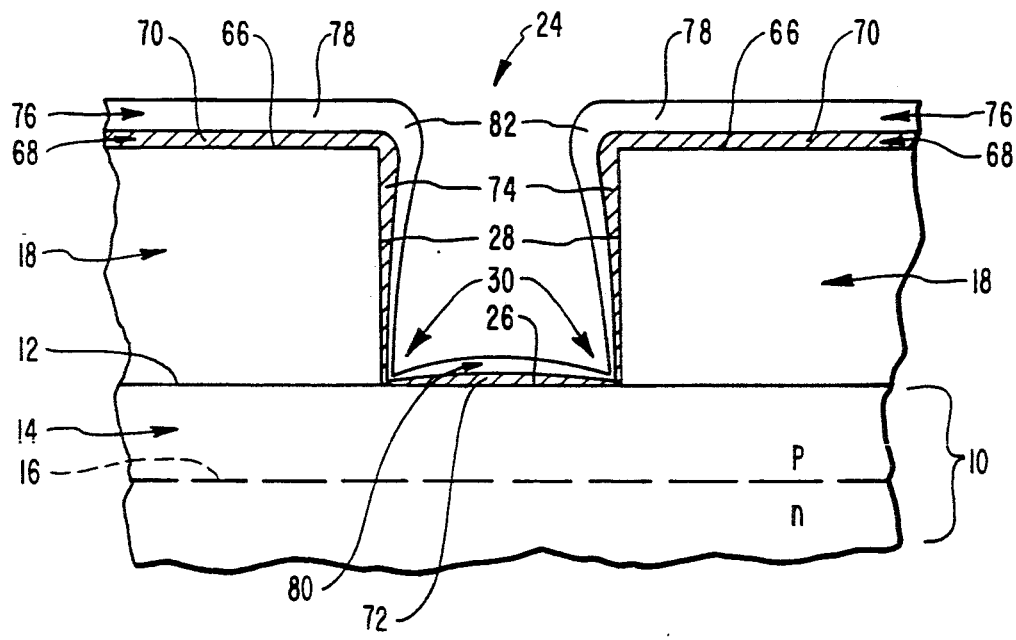

Thereafter, as shown in FIG. 6C, a base layer 76 of titanium nitride is formed on first layer 68 of titanium. This result is effected by using reactive sputter deposition in which an atmosphere of nitrogen is introduced to surround a titanium target biased as an anode and semiconductor substrate 10 biased as a cathode. The nitrogen is ionized into a plasma which impacts the titanium target freeing ions therefrom. These interact with the ambient nitrogen and are driven by the electrical bias toward the cathode substrate 10.

As with first layer 68 of titanium, a step coverage pattern of deposition is apparent. Accordingly, base layer 76 includes an upper portion 78 disposed on upper portion 70 of first layer 68 of titanium and a thin portion 80 disposed in the bottom of contact well 24 on thin portion 72 of first layer 68 of titanium. Thin portion 80 of base layer 76 of titanium nitride exhibits its greatest thickness at the center of contact well 24. From that maximum thickness, however, thin portion 80 reduces in thickness in the direction of corners 30 of contact well 24. Between upper portion 78 and thin portions 80 base layer 76 of titanium nitride includes an overhang portion 82 disposed on overhang portion 74 of first layer 68 of titanium.

It is the purpose of thin portion 72 of first layer 68 of titanium to develop a diffusion region in surface 12 of substrate 10 at the contact surface. It is anticipated that in the process all of the titanium in thin portion 72 will be consumed. Accordingly, and in order to control the depth of the resultant diffusion region, first layer 68 of titanium can possess a lesser thickness than was possible in the first prior art method for producing its diffusion barrier illustrated in FIGS. 2A-2D. On the other hand, it is the purpose of thin portion 80 of base layer 76 of titanium nitride to function as a barrier to silicon migration from substrate 10 into the metalized contact that will eventually fill contact well 24. In this role, it is important that thin portion 80 of base layer 76 of titanium nitride be sufficiently thick throughout the full extent thereof. The problems in this regard are most acute at corners 30 of contact well 24.

Figure 6D:
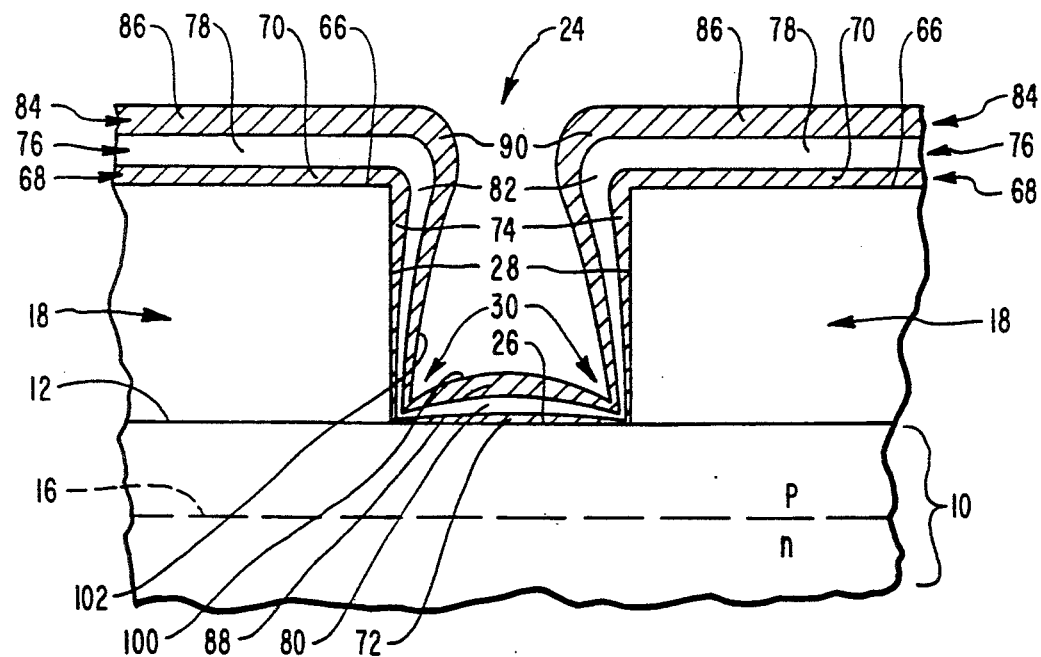

According to the method of the present invention, the effectiveness of thin portion 80 of base layer 76 of titanium nitride is enhanced by the deposition thereupon of another layer of titanium which is then annealed in an atmosphere of nitrogen to produce an additional backing layer of titanium nitride. As shown in FIG. 6D, a backing layer 84 of titanium is formed on base layer 76 of titanium nitride. Backing layer 84 is deposited using reactive sputter titanium in the same manner as the formation of first layer 68 of titanium. Again, step deposition patterning is apparent.

Accordingly, backing layer 84 comprises upper portions 86 on upper portion 78 of base layer 76 of titanium nitride. Backing layer 84 includes upper portions 86 above insulative layers 18 on upper portion 78 of base layer 76 of titanium nitride. Also, at floor 26 of contact well 24 backing layer 84 assumes the form of a thin portion 88 having a thickness in the range of from about 30 percent to about 50 percent of the thickness of upper portion 86. The reduced thickness in backing layer 84 at the bottom of contact well 24 arises again due to the step coverage phenomena in combination with the small diameter of contact well 24 when restricted by the deposition of overhang portion 74 of first layer 68 of titanium and overhang portion 82 of base layer 76 of titanium nitride. Between upper portion 86 and thin portion 88, backing layer 84 includes overhang portions 90 disposed on overhang portion 82 of base layer 86 of titanium nitride. Again, the thickness of both thin portion 88 and overhang portion 90 of backing layer 84 thin visibly in the vicinity of corners 30 of contact well 24. Nevertheless, as will be disclosed subsequently, the combination of backing layer 84 of titanium and the base layer 76 of titanium nitride ultimately serves to produce a reliable barrier to the migration of silicon from substrate 10 into the metalized contact that will fill contact well 24.

Advantageously, the deposition of first layer 68 of titanium, base layer 76 of titanium nitride, and backing layer 84 of titanium can all be performed in a single semiconductor processing chamber without removing the substrate. The resultant structure deposited comprises a layer of titanium nitride sandwiched between coextensive layers of titanium. Thus the structure illustrated in FIG. 6D comprises an intermediate semiconductor structure for subsequent annealing in nitrogen to produce a diffusion barrier for preventing migration of silicon from semiconductor substrate 10 across the interface between an electrical contact and the portion of the surface 12 of substrate 10 electrically coupled to the electrical contact.

Figure 6E:
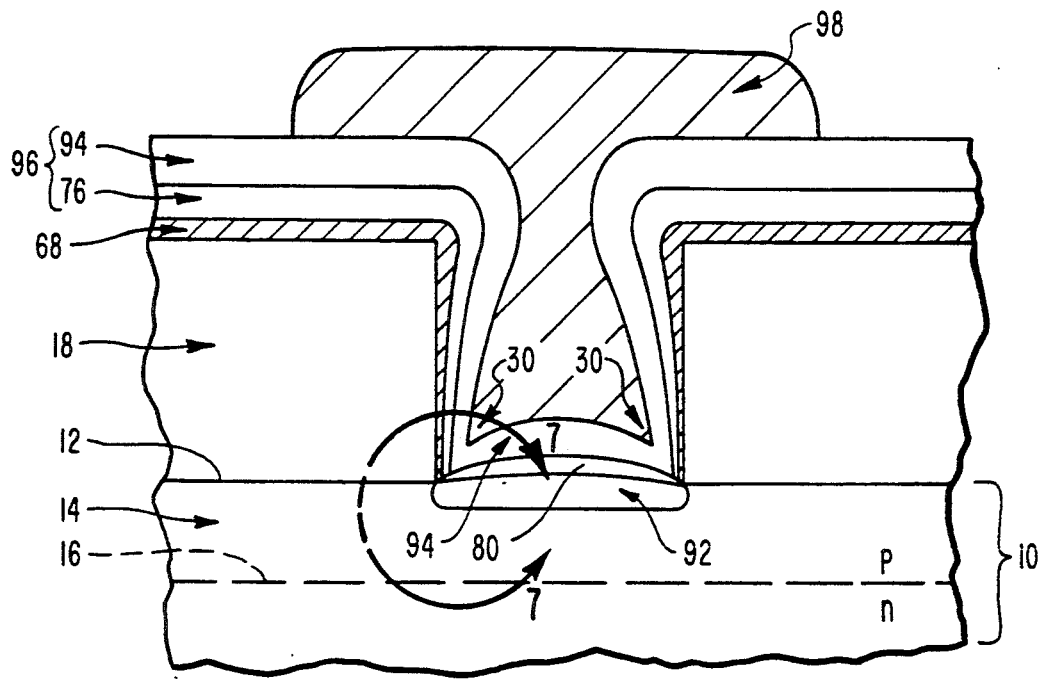

In the annealing step which will be described in relation to FIG. 6E, the structure illustrated in FIG. 6D is subjected to heat treatment in an atmosphere of nitrogen. This results in titanium from thin portion 72 of first layer 68 of titanium migrating into substrate 10 at the contact surface forming there a diffusion region 92 of titanium silicide. Inasmuch as thin portion 72 of first layer 68 of titanium is not relied upon in the method of the present invention for the creation of the barrier layer itself, a small quantity of titanium can be deposited in first layer 68 and the depth of diffusion region 92 carefully controlled.

Simultaneously during the heating process, backing layer 85 of titanium which is exposed to the ambient nitrogen forms backing layer 94 of titanium nitride, thereby adding to the thickness and security against silicon migration afforded by base layer 76 of titanium nitride. Together backing layer 94 of titanium nitride and base layer 76 of titanium nitride function as a composite strata 96 of titanium nitride disposed between the surface of diffusion region 92 and the metalized electrical contact 98 formed to fill contact well 24.

Figure 7:
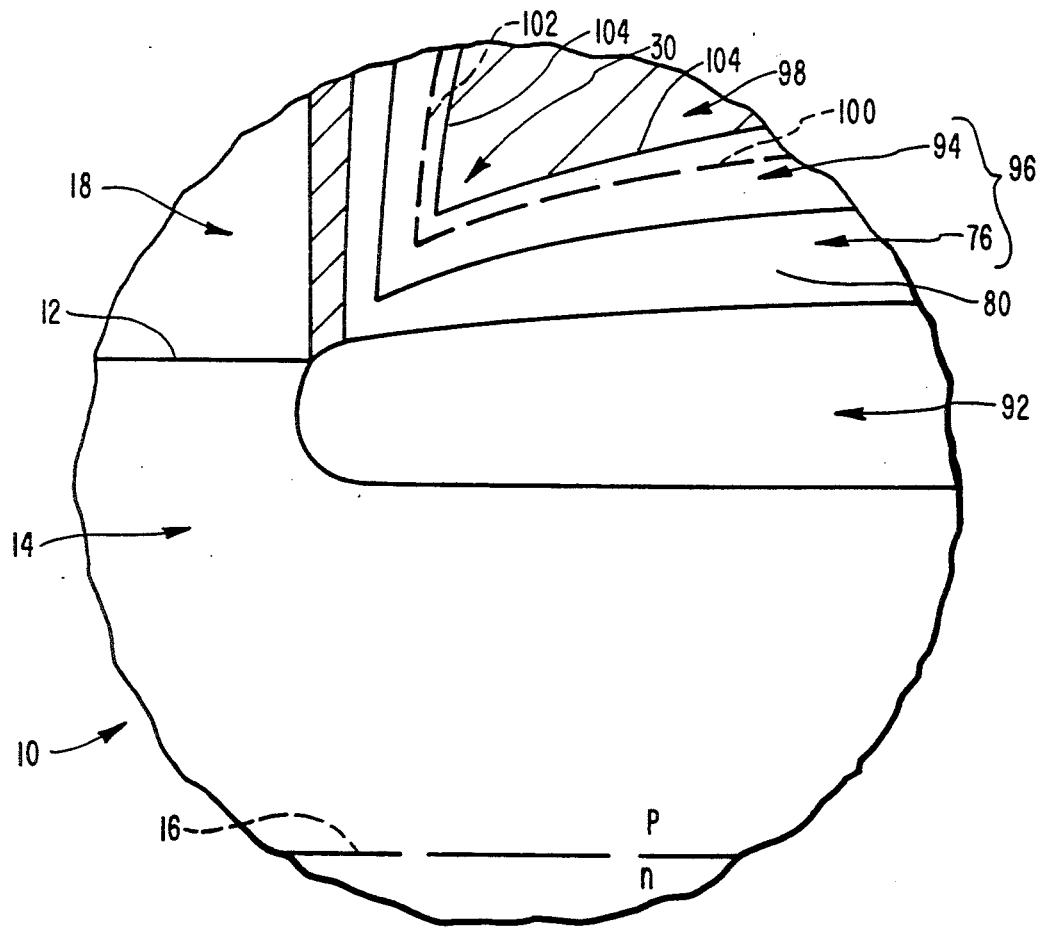
FIG. 7 is a detailed view of a portion of the structure illustrated in FIG. 6E.

FIG. 7 illustrates in enlarged detail the relationship of the components of composite strata 96. In particular, depicted for comparative purposes in FIG. 7 in dashed lines is the original surface 100 of thin portion 88 of backing layer 84 of titanium and the original surface 102 of overhang portion 90 of backing layer 84 of titanium. When backing layer 84 is converted to titanium nitride in the annealing process, the volume of the new material expands relative to the original titanium layer. Accordingly the surfaces 104 of backing layer 94 of titanium nitride are displaced as illustrated in FIG. 7 relative, respectively, to the corresponding upper surface 100 and outer surface 102 of the corresponding components of backing layer 84 of titanium. The increase in thickness is particularly useful in sealing breaks and in thickening the barrier layer at corners 30 of contact well 24. The volume increased by being experienced at the two relatively orthogonal surfaces, upper surface 100 of thin portion 88 and outer surface 102 of overhang portion 90, tends to close any gap in the barrier layer which might occur at corner 30. Typically, it is at corner 30 where the thinnest deposition of material occurs in known methods, both on floor 26 and walls 28 of contact well 24.

The combination of a layer of titanium nitride formed by reactive sputter deposition adjacent to and in contact with a layer of titanium nitride formed by annealing in an atmosphere of nitrogen produces a composite strata of titanium nitride which is capable of preventing migration of silicon from a substrate, such as substrate 10, into an electrical contact, such as electrical contact 98, during the operation of the semiconductor device of which the contact is a part. The use of a layer of reactive sputter deposited titanium nitride permits the underlying layer of titanium which is in contact with the substrate itself to be of such a thickness as to minimize the depth of the diffusion region created therebelow during the annealing process. When the backing layer of titanium is converted to titanium nitride during the annealing process, the effective thickness of the diffusion barrier created is enhanced both through the addition of a second layer of titanium nitride and at corners 30 at the contact opening by the expansion phenomena illustrated in FIG. 7.

An electrical contact employing therewith a diffusion barrier produced according to the method of the present invention is highly reliable in its ability to reduce pitting of the associated semiconductor surface, while simultaneously controlling the depth of the associated diffusion region of titanium silicate. In the process, a minimum quantity of titanium is deposited on the substrate, thereby contributing to the ability to employ metalized wiring traces of a desirably minimum thickness. All three deposited layers in the three-layer intermediate semiconductor structure by which the inventive diffusion barrier is created are able to be formed in the same semiconductor processing chamber.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Patent is:

1. A diffusion barrier for a semiconductor device to prevent the migration of silicon from the substrate in which the device is formed across an interface between an electrical contact formed in a contact well having a bottom and sides and a portion of the surface of the substrate electrically coupled thereto, said diffusion barrier comprising:
   (a) a diffusion region of titanium silicide in the portion of the surface of the substrate electrically coupled to the electrical contact;
   (b) a first composite strata of titanium nitride disposed at the bottom of said well between the surface of said diffusion region and the electrical contact, said composite strata of titanium nitride comprising a first base layer contacting the surface of the substrate and a first backing layer overlying said first base layer and annealed to form said first composite strata;
   (c) a peripheral layer of titanium formed on the sides of the contact well; and
   (d) a second composite strata of titanium nitride formed on the sides of said contact well over said peripheral layer of titanium, said second composite strata of titanium nitride comprising a second base layer contacting said peripheral layer of titanium and a second backing layer overlying said second base layer and annealed to form said second composite strata.

2. A diffusion barrier as recited in claim 1, wherein said diffusion region is formed by the migration of titanium from a first layer of titanium formed on the surface of the substrate.

3. A diffusion barrier as recited in claim 2, wherein said diffusion region is formed by heating the substrate and said first layer of titanium.

4. A diffusion barrier as recited in claim 2 wherein said first layer of titanium is formed by sputter deposition.

5. A diffusion barrier as recited in claim 1, wherein:
   (a) said first base layer comprises titanium nitride formed on the surface of the substrate by reactive sputter deposition; and
   (b) said first backing layer comprises titanium nitride formed by annealing a first backing layer of titanium deposited on said first base layer.

6. A diffusion barrier as recited in claim 5, wherein said first backing layer of titanium, is formed on said first base layer by sputter deposition.

7. A diffusion barrier as recited in claim 1, wherein:
   (a) said second base layer comprises titanium nitride formed on said peripheral layer of titanium by reactive sputter deposition; and
   (b) said second backing layer comprises titanium nitride formed by annealing a second backing layer of titanium deposited on said second base layer.

8. A diffusion barrier as recited in claim 1, wherein said second backing layer of titanium is integrally and simultaneously formed with said first backing layer of titanium.

9. A diffusion barrier as recited in claim 1, wherein said first composite strata of titanium nitride is integrally and simultaneously formed with said second composite strata of titanium nitride.

10. A diffusion barrier at the portion of the surface of a semiconductor substrate electrically coupled to a metalized electrical contact formed in a contact well having a bottom and sides, said diffusion barrier comprising:
    (a) a diffusion region of titanium silicide in the portion of the surface of the substrate electrically coupled to the electrical contact, said diffusion region having been formed during annealing of the semiconductor substrate by migration of titanium from a first layer of titanium formed on the surface of the substrate; and
    (b) a composite strata of titanium nitride disposed in the bottom of said contact well between the surface of said diffusion region and the electrical contact and along the sides of said contact well, said composite strata of titanium nitride comprising a base layer of titanium nitride contacting the surface of said diffusion region and a backing layer of titanium overlying said base layer and annealed in nitrogen to form said composite strata.

11. A diffusion barrier as recited in claim 10, wherein said composite strata of titanium nitride is capable of preventing migration of silicon from the substrate into the electrical contact, thereby minimizing pitting of the portion of the surface of the substrate electrically coupled to the electrical contact.

12. A diffusion barrier as recited in claim 10, wherein the thickness of said composite strata of titanium nitride is sufficient to prevent the migration of silicon from the substrate into the electrical contact.

13. An electrical contact formed through an insulative layer on a substrate to the surface thereof, the electrical contact comprising:
  (a) a contact well in the insulative layer, said contact well having a bottom and sides normal thereto, said bottom of said contact well defining a contact surface on the substrate;
  (b) a diffusion region of titanium silicide in said contact surface, said diffusion region having been formed during annealing of the semiconductor substrate by the migration of titanium from a first layer of titanium nitride on the surface of said contact region;
  (c) a composite strata of titanium nitride disposed on the bottom of said contact well on the surface of said diffusion region and on the sides of said contact well, said composite strata comprising a base layer contacting the surface of said diffusion region and a backing layer of titanium overlying said base layer and annealed in nitrogen to form said composite strata; and
  (d) a metalized contact engaging said composite strata of titanium nitride and filling said contact well.

14. An electrical contact as recited in claim 13, wherein said composite strata of titanium nitride is capable of preventing migration of silicon from the substrate into said metalized contact, thereby minimizing pitting of said contact surface.

15. An electrical contact as recited in claim 13, wherein the thickness of said composite strata of titanium nitride is sufficient to prevent the migration of silicon from the substrate into said metalized contact.

16. An intermediate semiconductor structure for annealing in nitrogen to produce a diffusion barrier for preventing migration of silicon from a semiconductor substrate across the interface between an electrical contact formed in a contact well having a bottom and sides and the portion of the surface of the substrate electrically coupled to the electrical contact, said intermediate semiconductor structure comprising:
  (a) a first layer of titanium on the bottom and sides of said well and contacting the portion of the surface of the substrate to be electrically coupled to the electrical contact;
  (b) a base layer of titanium nitride formed on said first layer of titanium at the bottom and sides of said well; and
  (c) a backing layer of titanium on said first base layer of titanium nitride at the bottom and sides of said well;
  whereby annealing of said intermediate semiconductor structure in nitrogen causes titanium from said first layer of titanium to migrate into the semiconductor substrate forming there a diffusion region of titanium silicate and causes said backing layer of titanium to form titanium nitride at the bottom and sides of said well.

17. An intermediate semiconductor structure as recited in claim 16, wherein said first layer of titanium is formed by sputter deposition.

18. An intermediate semiconductor structure as recited in claim 16, wherein said base layer of titanium nitride is formed by reactive sputter deposition.

19. An intermediate semiconductor structure as recited in claim 16, wherein said backing layer of titanium is formed by sputter deposition.

20. An intermediate semiconductor structure as recited in claim 16, wherein said first layer of titanium, said base layer of titanium nitride, and said backing layer of titanium are each formed in the same semiconductor chamber.

21. An intermediate semiconductor structure comprising:
  (a) a semiconductor substrate;
  (b) a layer of insulation on the surface of said semiconductor substrate;
  (c) a contact well formed through said layer of insulation to the surface of said semiconductor substrate, said contact well having a bottom and sides normal thereto, said bottom of said contact well defining a contact surface on the substrate;
  (d) a first layer of titanium on said sides of said well and on said contact surface;
  (e) a base layer of titanium nitride formed on said first layer of titanium at the bottom and sides of said well; and
  (f) a backing layer of titanium on said base layer of titanium nitride at the bottom and sides of said well;
  whereby annealing of said intermediate semiconductor structure in nitrogen causes titanium from said first layer of titanium to migrate into the semiconductor substrate forming there a diffusion region of titanium silicate and causes said backing layer of titanium to form titanium nitride at the bottom and sides of said well.

22. An intermediate semiconductor structure as recited in claim 21, wherein said first layer of titanium is formed by sputter deposition.

23. An intermediate semiconductor structure as recited in claim 21, wherein said base layer of titanium nitride is formed by reactive sputter deposition.

24. An intermediate semiconductor structure as recited in claim 21, wherein said backing layer of titanium is formed by sputter deposition.

25. An intermediate semiconductor structure as recited in claim 16, wherein said first layer of titanium, said base layer of titanium nitride, and said backing layer of titanium are each formed in a single semiconductor chamber.

26. An electrical contact formed through an insulative layer on a substrate to the surface thereof, the electrical contact comprising:
  (a) a contact well formed through the insulative layer, said contact well having a bottom and sides normal thereto, said bottom of said contact well defining a contact surface on the substrate;
  (b) a diffusion region of titanium silicide in said contact surface;
  (c) a peripheral layer of titanium deposited on said sides of said contact well;
  (d) a composite strata of titanium nitride formed on said peripheral layer of titanium and on said contact surface, said composite strata of titanium nitride comprising a base layer of titanium nitride contacting said bottom of said well and a backing layer of titanium overlying said base layer of titanium nitride and annealed to form said composite strata; and (e) a metalized contact engaging said composite strata of titanium nitride and filling said contact well.

27. An electrical contact as recited in claim 26, wherein said diffusion region is formed by the migration of titanium from a first layer of titanium on said contact surface.

28. An electrical contact as recited in claim 27, wherein said diffusion region is formed by heating the substrate and said first layer of titanium.

29. An electrical contact as recited in claim 26, wherein first layer of titanium is formed by sputter deposition.

30. An electrical contact as recited in claim 26, wherein:
   (a) said base layer comprises titanium nitride formed by reactive sputter deposition on said peripheral layer of titanium and on said contact surface; and
   (b) said backing layer comprises titanium nitride formed by annealing in nitrogen a layer of titanium deposited on said base layer.

31. An electrical contact as recited in claim 30, wherein said backing layer is formed on said base layer by sputter deposition.

* * * * *

UNITED STATES PATENT AND TRADEMARK OFFICE
CERTIFICATE OF CORRECTION

PATENT NO.  : 5,136,362

DATED       : August 4, 1992

INVENTOR(S) : MALCOLM K. GRIEF et al.

It is certified that error appears in the above-identified patent and that said Letters Patent is hereby corrected as shown below:

```
Title page, Abstract, line 19, after "but" insert --is--
Column 2, line 19, "then" should be --thin--
Column 3, line 39, "a" should be --made--
Column 5, line 12, "nitrite" should be --nitride--
Column 5, line 51, after "result" insert --.--
Column 5, line 51, "first" should be --First--
Column 7, line 52, "results" should be --result--
Column 14, line 29, delete ","
```

Signed and Sealed this

Fifth Day of April, 1994

Attest:

BRUCE LEHMAN

Attesting Officer

Commissioner of Patents and Trademarks